(12) United States Patent
Hsu

(10) Patent No.: US 9,553,169 B2
(45) Date of Patent: Jan. 24, 2017

(54) METHOD FOR MANUFACTURING AMOLED BACKPLANE

(71) Applicant: Shenzhen China Star Optoelectronics Technology Co., Ltd., Shenzhen, Guangdong (CN)

(72) Inventor: Yuanjun Hsu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 149 days.

(21) Appl. No.: 14/424,107

(22) PCT Filed: Feb. 6, 2015

(86) PCT No.: PCT/CN2015/072350
§ 371 (c)(1),
(2) Date: Feb. 26, 2015

(87) PCT Pub. No.: WO2016/070505
PCT Pub. Date: May 12, 2016

(65) Prior Publication Data
US 2016/0343828 A1    Nov. 24, 2016

(30) Foreign Application Priority Data
Nov. 3, 2014    (CN) .......................... 2014 1 0614402

(51) Int. Cl.
*H01L 29/66*    (2006.01)
*H01L 27/32*    (2006.01)
(Continued)

(52) U.S. Cl.
CPC ..... *H01L 29/66757* (2013.01); *H01L 27/3262* (2013.01); *H01L 27/3265* (2013.01);
(Continued)

(58) Field of Classification Search
CPC combination set(s) only.
See application file for complete search history.

(56) References Cited

U.S. PATENT DOCUMENTS

2007/0152217 A1* 7/2007 Lai ...................... H01L 27/1225
257/59
2009/0272978 A1* 11/2009 Liu ...................... H01L 27/1229
257/71
(Continued)

*Primary Examiner* — Mamadou Diallo
(74) *Attorney, Agent, or Firm* — Andrew C. Cheng

(57) ABSTRACT

The present invention provides a method for manufacturing an AMOLED backplane, in which after a first metal layer is patternized to form a first gate terminal (61), a second gate terminal (63), and an electrode plate (65), with the patternized first metal layer as a shielding layer, a patternized polysilicon layer is subjected to N-type light doping; and then, an insulation layer (7) is deposited and the insulation layer (7) is subjected to non-isotropic etching to form spacers (71), and with patternized first metal layer and the spacers (71) as a shielding layer, the patternized polysilicon layer is subjected to N-type heavy doping to form light-doping drain areas (N−) exactly below the spacers (71) on the opposite sides of the first gate terminal (61), whereby light-doping drain areas (N−) on opposite sides of a channel area of a switching TFT are made symmetric to each other and the length of the light-doping drain areas (N−) is shorten; a conduction current is increased; a photoelectric current can be effectively reduced; one photo mask can be saved; and the cost can be lowered down.

10 Claims, 8 Drawing Sheets

(51) Int. Cl.
*H01L 29/45* (2006.01)
*H01L 29/49* (2006.01)

(52) U.S. Cl.
CPC ........ *H01L 29/458* (2013.01); *H01L 29/4908* (2013.01); *H01L 2227/323* (2013.01)

(56) References Cited

U.S. PATENT DOCUMENTS

| | | | | |
|---|---|---|---|---|
| 2010/0271349 A1* | 10/2010 | Liu | ...................... | G09G 3/3225 345/205 |
| 2013/0337596 A1* | 12/2013 | Hung | ...................... | H01L 51/56 438/34 |
| 2015/0340389 A1* | 11/2015 | Liu | ...................... | H01L 27/1255 257/71 |
| 2016/0043351 A1* | 2/2016 | Hsu | ...................... | H01L 51/002 438/99 |

\* cited by examiner

METHOD FOR MANUFACTURING AMOLED BACKPLANE

BACKGROUND OF THE INVENTION

1. Field of the Invention

The present invention relates to the field of displaying technology, and in particular to a method for manufacturing an active matrix organic light-emitting diode (AMOLED) backplane.

2. The Related Arts

In the field of displaying technology, flat panel display technology, such as liquid crystal displays (LCDs) and organic light-emitting diodes (OLEDs), has gradually taken the place of cathode ray tube (CRT) displays, and among them, the OLEDs have various advantages, such as being self-luminous, low driving voltage, high light emission efficiency, short response time, high clarity and contrast, virtually 180° view angle, wide temperature range of applications, being capable of flexible displaying, and full color displaying in a large area, and are considered a display device with the best potential of development.

The OLEDs can be classified, according to the type of driving, as passive OLEDs (such as passive matrix OLEDs (PMOLEDs)) and active OLEDs (such as active matrix OLEDs (AMOLEDs)). The AMOLEDs are generally a self-luminous device composed of a low-temperature polysilicon (LTPS) driving backplane and an electroluminescent layer. LTPS has high electron mobility. For AMOLED, using the material of LTPS has various advantages including high resolution, high response speed, high brightness, high aperture ratio, and low power consumption.

A structure of a commonly used AMOLED backplane in the prior art techniques is illustrated in FIG. 1. The manufacturing process of the AMOLDED backplane is generally as follows:

Step 1: depositing a buffer layer 200 on a substrate 100;

Step 2: depositing an amorphous (a-Si) layer on the buffer layer 200 and applying laser treatment to crystalize and convert the amorphous silicon layer into a polysilicon layer; and then applying photolithographic and etching processes to subject the polysilicon layer to patterning treatment so as to form a first polysilicon section 301, a second polysilicon section 303, and a third polysilicon section 305 that are arranged to be spaced from each other;

Step 3: depositing a gate insulation layer 400;

Step 4: applying a photolithographic process to form a first photoresist pattern on the gate insulation layer 400;

Step 5: with the first photoresist pattern as a shielding layer, subjecting the patternized polysilicon layer to P-type heavy doping so as to form P-type heavy-doping areas P+ on opposite sides of the second polysilicon section 303 and the third polysilicon section 305;

Step 6: first removing the first photoresist pattern and then applying a photolithographic process to form a second photoresist pattern on the gate insulation layer;

Step 7: with the second photoresist pattern as a shielding layer, subjecting the patternized polysilicon layer to N-type heavy doping to form N-type heavy-doping areas N+ on opposite sides of the first polysilicon section 301;

Step 8: removing the second photoresist pattern and depositing and patterning a first metal layer on the gate insulation layer 400 to form a first gate terminal 601, a second gate terminal 605, and an electrode plate 603;

Step 9: with the patternized first metal layer as a shielding layer, subjecting the patternized polysilicon layer to ion implanting (self-align) to form light-doping drain areas N– on opposite sides of the first polysilicon section 301.

Step 10: sequentially forming an interlayer insulation layer 700, first and second source/drain terminals 810, 830, a planarization layer 900, an anode 1000, a pixel definition layer 1100, and photo spacers 1200 on the gate insulation layer 400.

The first source/drain terminals 810 are electrically connected to the N-type heavy-doping areas N+ of the first polysilicon section 301 and the second source/drain terminals 830 are electrically connected to the P-type heavy-doping areas P+ of the second polysilicon section 303; and the anode 1000 is electrically connected to the second source/drain terminals 830.

The first polysilicon section 301, the first gate terminal 601, and the first source/drain terminals 810 collectively form a switching TFT; the second polysilicon section 303, the second gate terminal 603, and the second source/drain terminals 830 collectively form a driving TFT; and the third polysilicon section 305 and the electrode plate 605 collectively form a storage capacitor An AMOLED backplane manufactured with the above-described method suffers certain problems. If the photolithographic process of Step 6 that is conducted before N-type heavy doping is shifted, it is easy to make the light-doping drain areas that are located on opposite sides of a channel area of switching TFT not symmetric.

SUMMARY OF THE INVENTION

An object of the present invention is to provide a method for manufacturing an AMOLED backplane, which makes light-doping drain areas on opposite sides of a channel area of a switching thin-film transistor (TFT) symmetric to each other, increases a conduction current, reduces a photoelectric current, and saves one photo mask and lowers down cost.

To achieve the above object, the present invention provides a method for manufacturing an active matrix organic light-emitting diode (AMOLED) backplane, which sequentially deposits a buffer layer and an amorphous silicon layer on a substrate, crystalizes and converts the amorphous silicon layer into a polysilicon layer and patternizes the polysilicon layer, and after depositing a gate insulation layer, first applies a photoresist pattern formed with a photolithographic process as a shielding layer to subject the patternized polysilicon layer to P-type heavy doping; and then deposits and patternizes a first metal layer on the gate insulation layer to form a gate terminal and applies the patternized first metal layer as a shielding layer to subject the patternized polysilicon layer to N-type light doping; and then deposits an insulation layer and subjects the insulation layer to non-isotropic etching to form spacers, and then applies the patternized first metal layer and the spacers as a shielding layer to subject the patternized polysilicon layer to N-type heavy doping to form symmetric light-doping drain areas.

The method for manufacturing an AMOLED backplane comprises the following steps:

(1) providing a substrate and depositing a buffer layer on the substrate;

(2) depositing an amorphous silicon layer on the buffer layer and subjecting the amorphous silicon layer to excimer laser annealing treatment so as to crystalize and convert the amorphous silicon layer into a polysilicon layer; and then subjecting the polysilicon layer to patterning treatment so as to form a first polysilicon section, a second polysilicon section, and a third polysilicon section that are spaced from each other, where the third polysilicon section is located between the first polysilicon section and the second polysilicon section;

(3) depositing a gate insulation layer on the buffer layer and the first, second, and third polysilicon sections;

(4) applying a photolithographic process to form a photoresist pattern on the gate insulation layer, where the photoresist pattern completely shields the first polysilicon section, shields a middle portion of the second polysilicon section, and completely shields no third polysilicon section;

(5) with the photoresist pattern as a shielding layer, subjecting the patternized polysilicon layer to P-type heavy doping so as to form P-type heavy-doping areas respectively on opposite sides of the second polysilicon section and the third polysilicon section;

(6) removing the photoresist pattern and depositing and patterning a first metal layer on the gate insulation layer so as to form a first gate terminal, a second gate terminal, and an electrode plate, where the first gate terminal is located above a middle portion of the first polysilicon section;

(7) with the patternized first metal layer as a shielding layer, subjecting the patternized polysilicon layer to N-type light doping so as to form N-type light-doping areas respectively on opposite sides of the first polysilicon section that are not shielded by the first gate terminal;

(8) depositing an insulation layer on the gate insulation layer and the first gate terminal, the second gate terminal, and the electrode plate and then, subjecting the insulation layer to non-isotropic etching to form spacers, where the spacers that are located on the opposite sides of the first gate terminal are symmetric;

(9) with the patternized first metal layer and the spacers as a shielding layer, subjecting the patternized polysilicon layer to N-type heavy doping so as to form symmetric light-doping drain areas exactly below the spacers on the opposite sides of the first gate terminal; and

(10) applying depositing, photolithographic, and etching processes to form, in sequence, an interlayer insulation layer, first and second source/drain terminals, a planarization layer, an anode, a pixel definition layer, and photo spacers on the gate insulation layer, wherein the first source/drain terminals are electrically connected to the N-type heavy-doping areas of the first polysilicon section and the second source/drain terminals are electrically connected to the P-type heavy-doping areas of the second polysilicon section and the anode is electrically connected to the second source/drain terminals; and the first polysilicon section, the first gate terminal, and the first source/drain terminals collectively form a switching thin-film transistor (TFT); the second polysilicon section, the second gate terminal, and the second source/drain terminals collectively form a driving TFT; and the third polysilicon section and the electrode plate collectively form a storage capacitor.

The insulation layer comprises a silicon rich oxide layer or a silicon rich nitride layer.

The insulation layer has a thickness of 0.2-0.5 um.

The P-type heavy doping applies a concentration that is higher than a concentration of the N-type heavy doping.

The buffer layer comprises a silicon oxide layer, a silicon nitride layer, or a combination thereof.

The interlayer insulation layer comprises a silicon oxide layer, a silicon nitride layer, or a combination thereof.

The first gate terminal, the second gate terminal, and the electrode plate comprise a material of Mo.

The first and second source/drain terminals comprise a material of Ti/Al/Ti.

The anode comprises a material of ITO/Ag/ITO.

The efficacy of the present invention is that the present invention provides a method for manufacturing an AMOLED backplane, in which after a first metal layer is patternized to form a first gate terminal, a second gate terminal, and an electrode plate, with the patternized first metal layer as a shielding layer, a patternized polysilicon layer is subjected to N-type light doping; and then, an insulation layer is deposited and the insulation layer is subjected to non-isotropic etching to form spacers, and with patternized first metal layer and the spacers as a shielding layer, the patternized polysilicon layer is subjected to N-type heavy doping to form light-doping drain areas exactly below the spacers on the opposite sides of the first gate terminal, whereby, on the one hand, light-doping drain areas on opposite sides of a channel area of a switching TFT are made symmetric to each other and the length of the light-doping drain areas is shorten and a conduction current is increased; and on the other hand, the material of the spacers is silicon rich oxide or silicon rich nitride that absorbs light so that a photoelectric current can be effectively reduced, one photo mask can be saved for forming the N-type heavy-doping areas and the cost can be lowered down.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
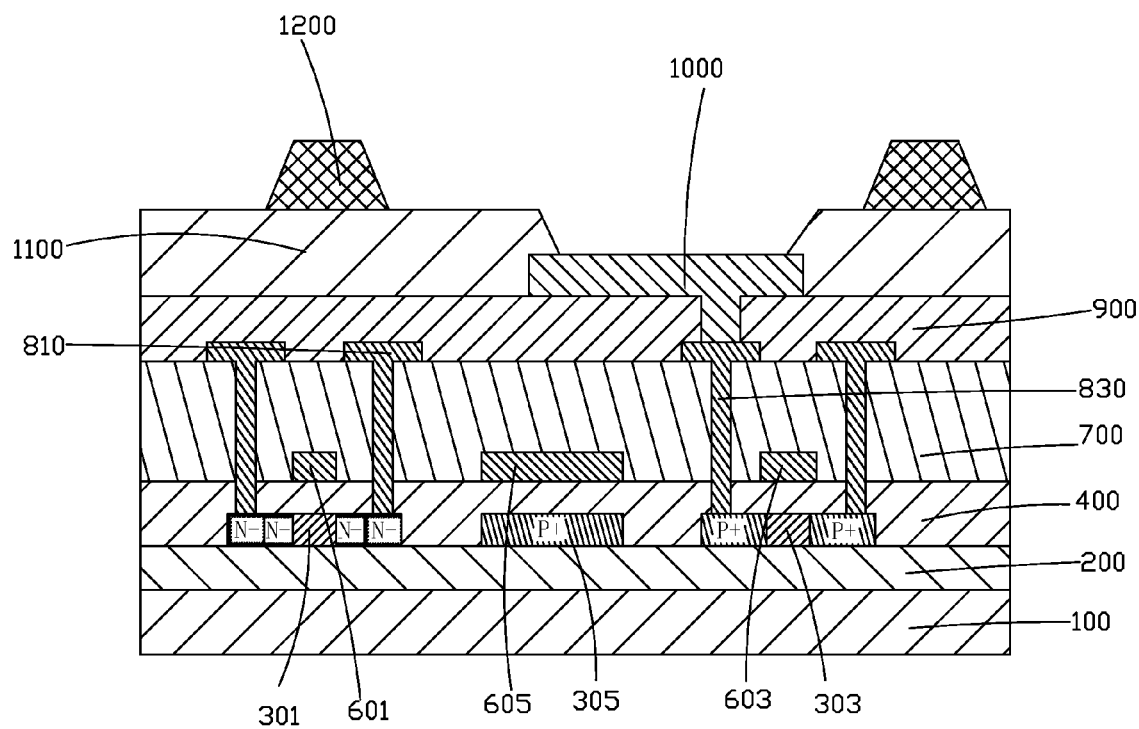
FIG. 1 is a schematic view showing the structure of a conventional active matrix organic light-emitting diode (AMOLED) backplane.
Figure 2:
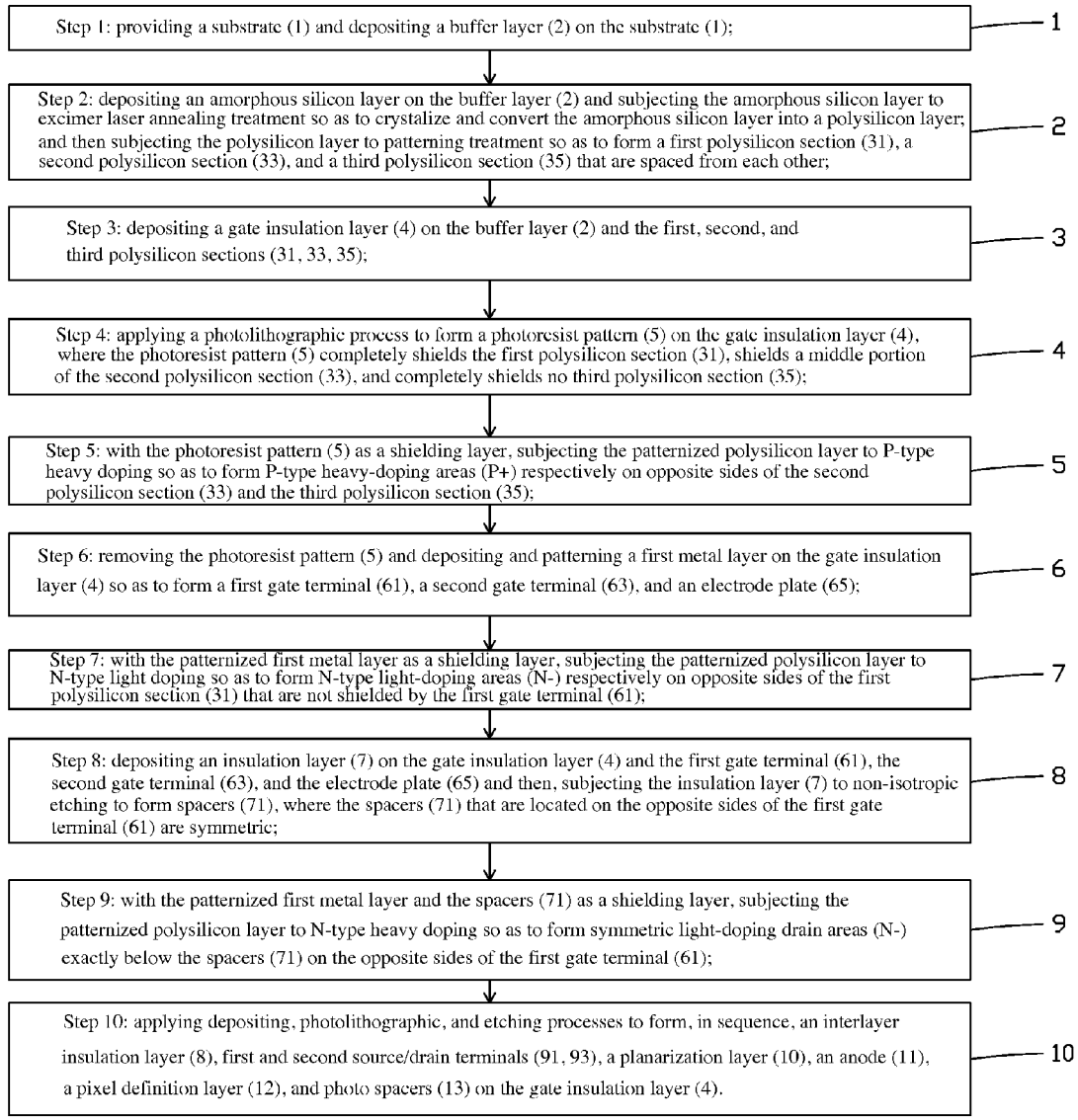
FIG. 2 is a flow chart illustrating a method for manufacturing an AMOLED backplane according to the present invention.

Referring to FIG. 2, the present invention provides a method for manufacturing an active matrix organic light-emitting diode (AMOLED) backplane, which specifically comprises the following steps:

Step 1: providing a substrate 1 and depositing a buffer layer 2 on the substrate 1.

The substrate 1 is a transparent substrate, and preferably, the substrate 1 is a glass substrate or a plastic substrate.

The buffer layer 2 comprises a silicon oxide (SiOx) layer, a silicon nitride (SiNx) layer, or a combination thereof.

Figure 3:
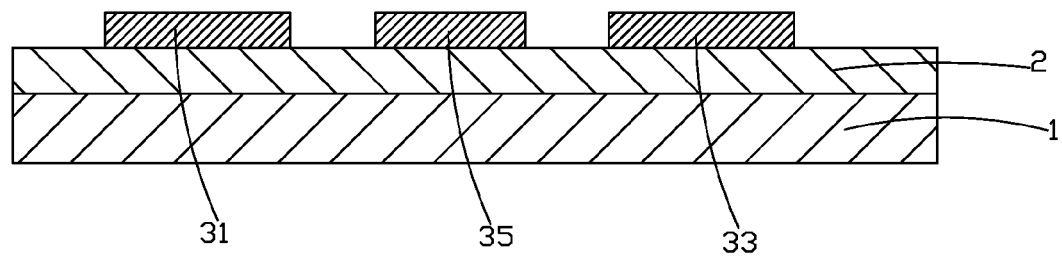
FIG. 3 is a schematic view illustrating a second step of the method for manufacturing an AMOLED backplane according to the present invention.

Step 2: as shown in FIG. 3, depositing an amorphous silicon layer on the buffer layer 2 and subjecting the amorphous silicon layer to excimer laser annealing treatment so as to crystalize and convert the amorphous silicon layer into a polysilicon layer; and then subjecting the polysilicon layer to patterning treatment so as to form a first polysilicon section 31, a second polysilicon section 33, and a third polysilicon section 35 that are spaced from each other.

The third polysilicon section 35 is located between the first polysilicon section 31 and the second polysilicon section 33.

Figure 4:
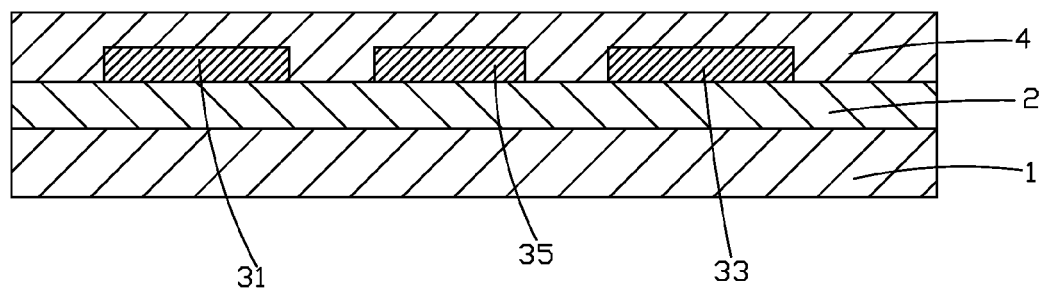
FIG. 4 is a schematic view illustrating a third step of the method for manufacturing an AMOLED backplane according to the present invention.

Step 3: as shown in FIG. 4, depositing a gate insulation layer 4 on the buffer layer 2 and the first, second, and third polysilicon sections 31, 33, 35.

Figure 5:
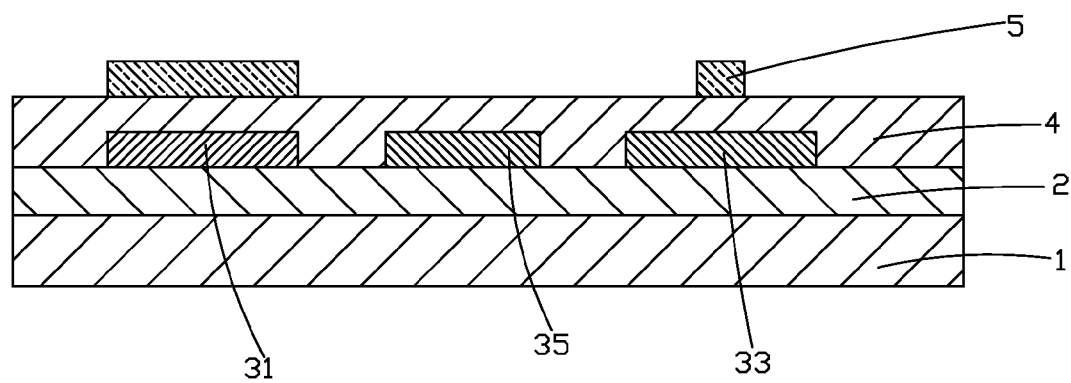
FIG. 5 is a schematic view illustrating a fourth step of the method for manufacturing an AMOLED backplane according to the present invention.

Step 4: as shown in FIG. 5, applying a photolithographic process to form a photoresist pattern 5 on the gate insulation layer 4.

The photoresist pattern 5 completely shields the first polysilicon section 31, shields a middle portion of the second polysilicon section 33, and completely shields no third polysilicon section 35.

Figure 6:
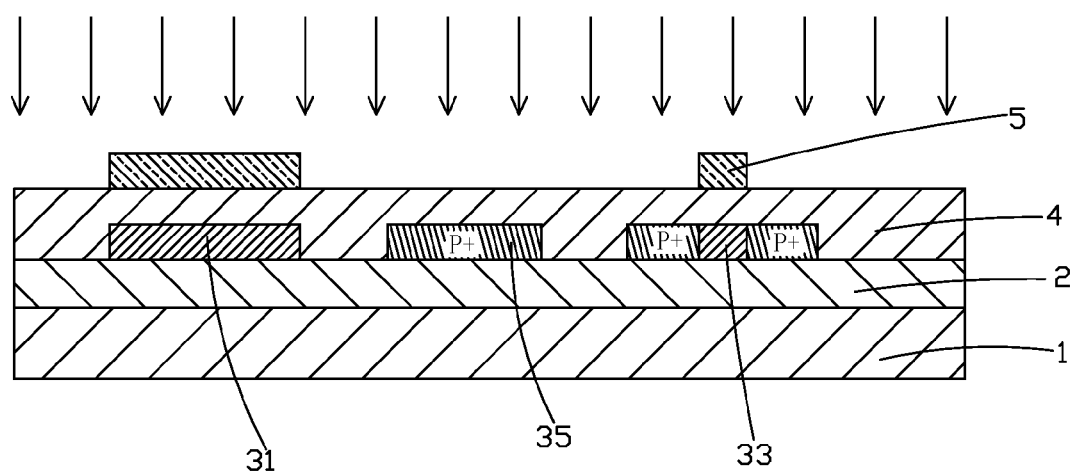
FIG. 6 is a schematic view illustrating a fifth step of the method for manufacturing an AMOLED backplane according to the present invention.

Step 5: as shown in FIG. 6, with the photoresist pattern 5 as a shielding layer, subjecting the patternized polysilicon layer to P-type heavy doping so as to form P-type heavy-doping areas P+ respectively on opposite sides of the second polysilicon section 33 and the third polysilicon section 35.

Since the photoresist pattern 5 completely shields no third polysilicon section 35, after the P-type heavy doping, the electrical conductivity of the third polysilicon section 35 is greatly improved.

Figure 7:
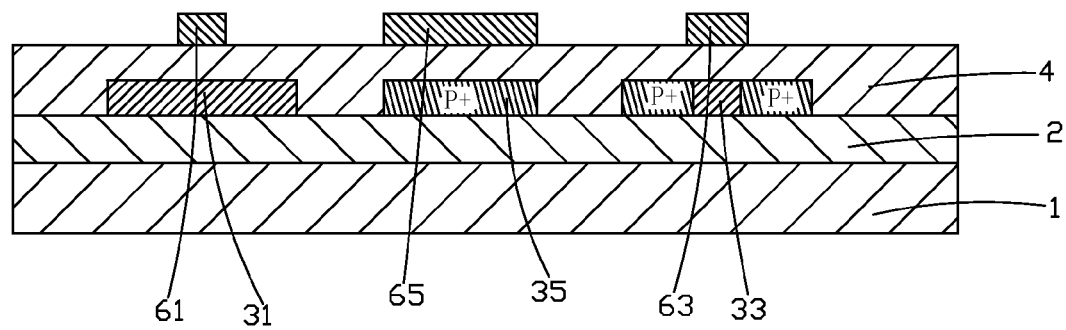
FIG. 7 is a schematic view illustrating a sixth step of the method for manufacturing an AMOLED backplane according to the present invention.

Step 6: as shown in FIG. 7, removing the photoresist pattern 5 and depositing and patterning a first metal layer on the gate insulation layer 4 so as to form a first gate terminal 61, a second gate terminal 63, and an electrode plate 65.

Specifically, the first gate terminal 61 is located above a middle portion of the first polysilicon section 31; the second gate terminal 63 is located above the middle portion of the second polysilicon section 33; and the electrode plate 65 and the third polysilicon section 35 correspond to each other.

The first gate terminal 61, the second gate terminal 63, and the electrode plate 65 are made of a material of molybdenum (Mo).

Figure 8:
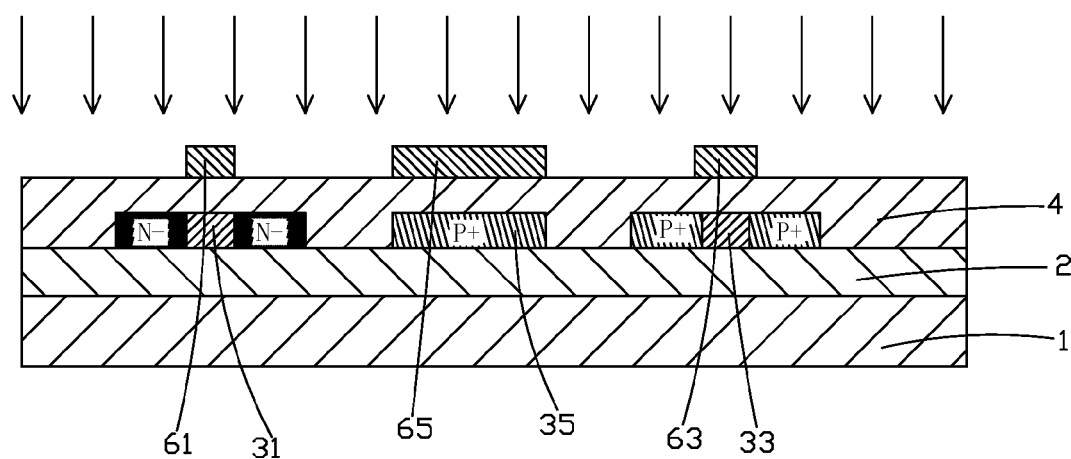
FIG. 8 is a schematic view illustrating a seventh step of the method for manufacturing an AMOLED backplane according to the present invention.

Step 7: as shown in FIG. 8, with the patternized first metal layer, which is the first gate terminal 61, the second gate terminal 63, and the electrode plate 65, as a shielding layer, subjecting the patternized polysilicon layer to N-type light doping so as to form N-type light-doping areas N- respectively on opposite sides of the first polysilicon section 31 that are not shielded by the first gate terminal 61.

Figure 9:
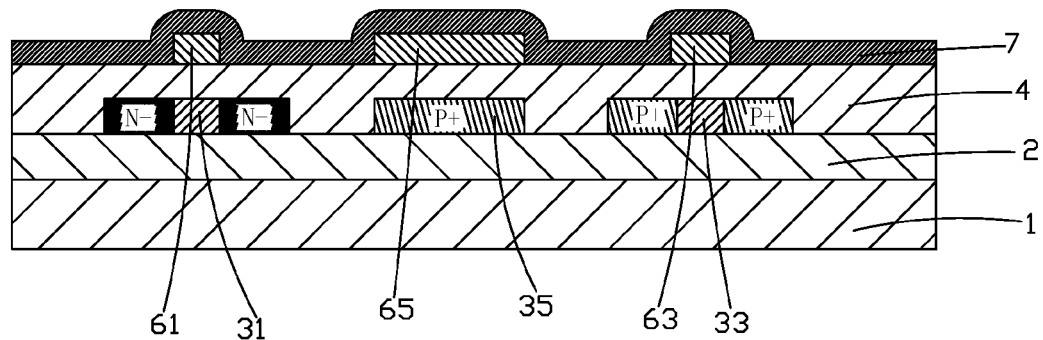
FIG. 9 is a schematic view illustrating deposition of an insulation layer in an eighth step of the method for manufacturing an AMOLED backplane according to the present invention.
Figure 10:
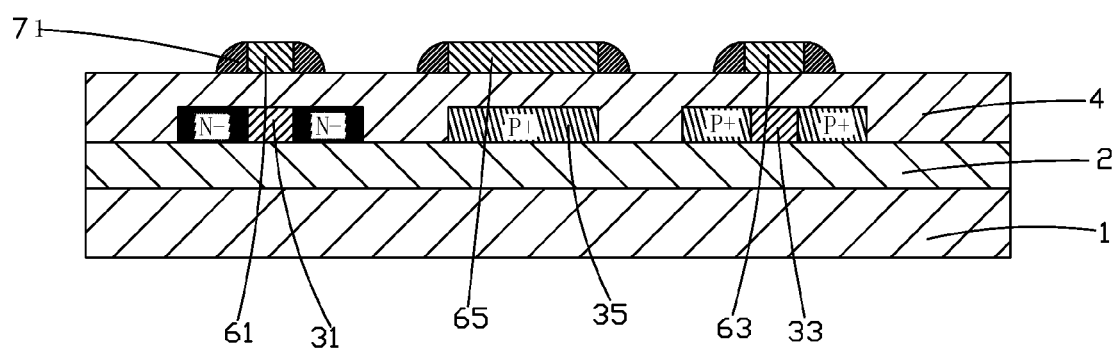
FIG. 10 is a schematic view illustrating formation of spacers in the eighth step of the method for manufacturing an AMOLED backplane according to the present invention.

Step 8: as shown in FIGS. 9 and 10, first depositing an insulation layer 7 on the gate insulation layer 4 and the first gate terminal 61, the second gate terminal 63, and the electrode plate 65, where the insulation layer 7 has a thickness of 0.2-0.5 um and comprises a material of silicon rich oxide (SRO) or silicon rich nitride (SRN); and then subjecting the insulation layer 7 to non-isotropic etching to form spacers 71, where the spacers 71 are respectively located on opposite sides of the first gate terminal 61, the second gate terminal 63, and the electrode plate 65.

The spacers 71 that are located on the opposite sides of the first gate terminal 61 are symmetric.

Figure 11:
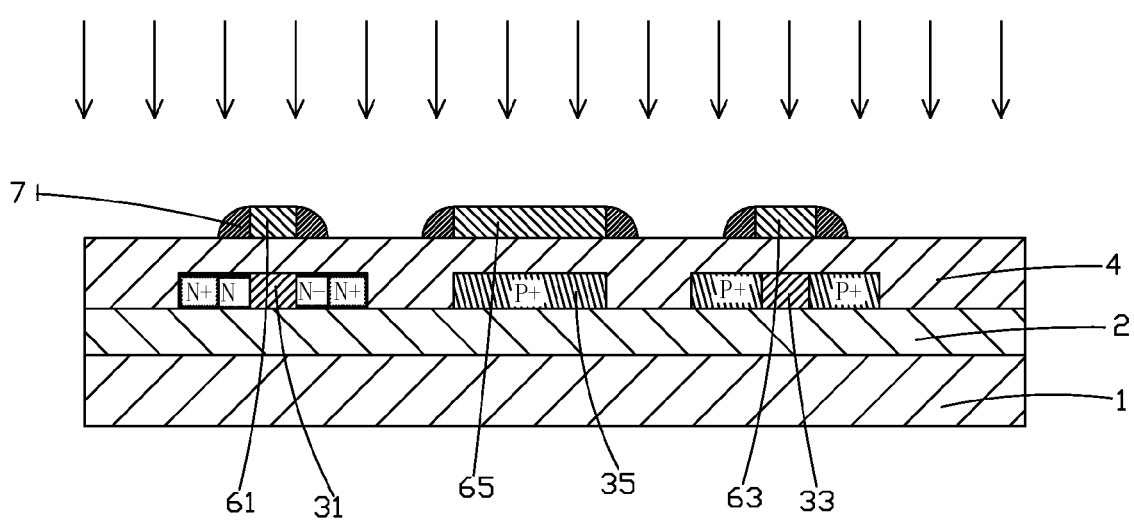
FIG. 11 is a schematic view illustrating a ninth step of the method for manufacturing an AMOLED backplane according to the present invention.

Step 9: as shown in FIG. 11, with the patternized first metal layer and the spacers 71 as a shielding layer, subjecting the patternized polysilicon layer to N-type heavy doping so as to form light-doping drain areas N- exactly below the spacers 71 on the opposite sides of the first gate terminal 61 and forming N-type heavy-doping areas N+ on outer sides of the light-doping drain areas N-.

Since the spacers 71 located on the opposite sides of the first gate terminal 61 are symmetric, the light-doping drain areas N- formed exactly below the spacers 71 located on the opposite sides of the first gate terminal 61 are also symmetric.

It is noted that in Step 9, the N-type heavy doping employs a concentration that is less than the concentration of the P-type heavy doping carried out in Step 5, the N-type heavy doping imposes a relatively small influence on the electrical conductivity of the P-type heavy-doping areas P+ on the opposite sides of the second polysilicon section 33.

Figure 12:
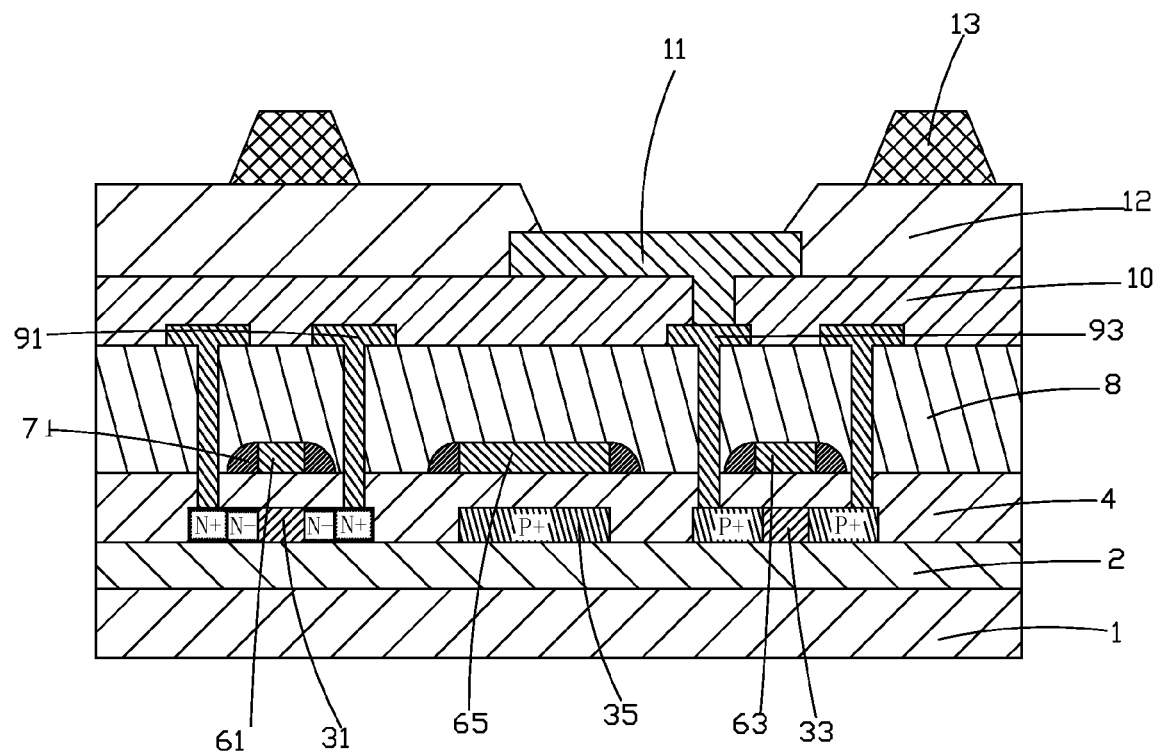
FIG. 12 is a schematic view illustrating a tenth step of the method for manufacturing an AMOLED backplane according to the present invention.

Step 10: as shown in FIG. 12, applying depositing, photolithographic, and etching processes to form, in sequence, an interlayer insulation layer 8, first and second source/drain terminals 91, 93, a planarization layer 10, an anode 11, a pixel definition layer 12, and photo spacers 13 on the gate insulation layer 4.

The first source/drain terminals 91 are electrically connected to the N-type heavy-doping areas N+ of the first polysilicon section 31 and the second source/drain terminals 93 are electrically connected to the P-type heavy-doping areas P+ of the second polysilicon section 33; and the anode 11 is electrically connected to the second source/drain terminals 93.

The first polysilicon section 31, the first gate terminal 61, and the first source/drain terminals 91 collectively form a switching thin-film transistor (TFT); the second polysilicon section 33, the second gate terminal 63, and the second source/drain terminals 93 collectively form a driving TFT; and the third polysilicon section 35 and the electrode plate 65 collectively form a storage capacitor. The storage capacitor is located between the switching TFT and the driving TFT.

Specifically, the interlayer insulation layer 8 comprises a silicon oxide (SiOx) layer, a silicon nitride (SiNx) layer, or a combination thereof.

The first and second source/drain terminals 91, 93 comprise a material of titanium/aluminum/titanium (Ti/Al/Ti).

The anode comprises a material of indium tin oxide/silver/indium tin oxide (ITO/Ag/ITO).

The above-described method for manufacturing an AMOLED backplane can shorten the length of the light-doping drain areas N− and increase conduction current due to the symmetry of the light-doping drain areas N− on the opposite sides of a channel area of the switching TFT. Since silicon rich oxide or silicon rich nitride that makes the spacers 71 may absorb light, a photoelectric current can be effectively reduced. And, the patternized first metal layer and the spacers 71 are used as a shielding layer for the N-type heavy-doping areas N+, and compared to the conventional method where a photoresist pattern formed through a photolithographic process is used as a shielding layer, one photo mask can be saved and the cost can be lowered down.

In summary, the present invention provides a method for manufacturing an AMOLED backplane, in which after a first metal layer is patternized to form a first gate terminal, a second gate terminal, and an electrode plate, with the patternized first metal layer as a shielding layer, a patternized polysilicon layer is subjected to N-type light doping; and then, an insulation layer is deposited and the insulation layer is subjected to non-isotropic etching to form spacers, and with patternized first metal layer and the spacers as a shielding layer, the patternized polysilicon layer is subjected to N-type heavy doping to form light-doping drain areas exactly below the spacers on the opposite sides of the first gate terminal, whereby, on the one hand, light-doping drain areas on opposite sides of a channel area of a switching TFT are made symmetric to each other and the length of the light-doping drain areas is shorten and a conduction current is increased; and on the other hand, the material of the spacers is silicon rich oxide or silicon rich nitride that absorbs light so that a photoelectric current can be effectively reduced, one photo mask can be saved for forming the N-type heavy-doping areas and the cost can be lowered down.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an active matrix organic light-emitting diode (AMOLED) backplane, which sequentially deposits a buffer layer and an amorphous silicon layer on a substrate, crystalizes and converts the amorphous silicon layer into a polysilicon layer and patternizes the polysilicon layer, and after depositing a gate insulation layer, first applies a photoresist pattern formed with a photolithographic process as a shielding layer to subject the patternized polysilicon layer to P-type heavy doping; and then deposits and patternizes a first metal layer on the gate insulation layer to form a gate terminal and applies the patternized first metal layer as a shielding layer to subject the patternized polysilicon layer to N-type light doping; and then deposits an insulation layer and subjects the insulation layer to non-isotropic etching to form spacers, and then applies the patternized first metal layer and the spacers as a shielding layer to subject the patternized polysilicon layer to N-type heavy doping to form symmetric light-doping drain areas;

wherein the method comprises the following steps:
(1) providing a substrate and depositing a buffer layer on the substrate;
(2) depositing an amorphous silicon layer on the buffer layer and subjecting the amorphous silicon layer to excimer laser annealing treatment so as to crystalize and convert the amorphous silicon layer into a polysilicon layer; and then subjecting the polysilicon layer to patterning treatment so as to form a first polysilicon section, a second polysilicon section, and a third polysilicon section that are spaced from each other, where the third polysilicon section is located between the first polysilicon section and the second polysilicon section;
(3) depositing a gate insulation layer on the buffer layer and the first, second, and third polysilicon sections;
(4) applying a photolithographic process to form a photoresist pattern on the gate insulation layer, where the photoresist pattern completely shields the first polysilicon section, shields a middle portion of the second polysilicon section, and completely shields no third polysilicon section;
(5) with the photoresist pattern as a shielding layer, subjecting the patternized polysilicon layer to P-type heavy doping so as to form P-type heavy-doping areas respectively on opposite sides of the second polysilicon section and the third polysilicon section;
(6) removing the photoresist pattern and depositing and patterning a first metal layer on the gate insulation layer so as to form a first gate terminal, a second gate terminal, and an electrode plate, where the first gate terminal is located above a middle portion of the first polysilicon section;
(7) with the patternized first metal layer as a shielding layer, subjecting the patternized polysilicon layer to N-type light doping so as to form N-type light-doping areas respectively on opposite sides of the first polysilicon section that are not shielded by the first gate terminal;
(8) depositing an insulation layer on the gate insulation layer and the first gate terminal, the second gate terminal, and the electrode plate and then, subjecting the insulation layer to non-isotropic etching to form spacers, where the spacers that are located on the opposite sides of the first gate terminal are symmetric;
(9) with the patternized first metal layer and the spacers as a shielding layer, subjecting the patternized polysilicon layer to N-type heavy doping so as to form symmetric light-doping drain areas exactly below the spacers on the opposite sides of the first gate terminal; and
(10) applying deposition, photolithographic, and etching processes to form, in sequence, an interlayer insulation layer, first and second source/drain terminals, a planarization layer, an anode, a pixel definition layer, and photo spacers on the gate insulation layer, wherein the first source/drain terminals are electrically connected to the N-type heavy-doping areas of the first polysilicon section and the second source/drain terminals are electrically connected to the P-type heavy-doping areas of the second polysilicon section and the anode is electrically connected to the second source/drain terminals; and the first polysilicon section, the first gate terminal, and the first source/drain terminals collectively form a switching thin-film transistor (TFT); the second polysilicon section, the second gate terminal, and the second source/drain terminals collectively form a driving TFT; and the third polysilicon section and the electrode plate collectively form a storage capacitor.

2. The method for manufacturing an AMOLED backplane as claimed in claim 1, wherein the insulation layer comprises a silicon rich oxide layer or a silicon rich nitride layer.

3. The method for manufacturing an AMOLED backplane as claimed in claim 1, wherein the insulation layer has a thickness of 0.2-0.5 um.

4. The method for manufacturing an AMOLED backplane as claimed in claim 1 wherein the P-type heavy doping applies a concentration that is higher than a concentration of the N-type heavy doping.

5. The method for manufacturing an AMOLED backplane as claimed in claim 1, wherein the buffer layer comprises a silicon oxide layer, a silicon nitride layer, or a combination thereof.

6. The method for manufacturing an AMOLED backplane as claimed in claim 1, wherein the interlayer insulation layer comprises a silicon oxide layer, a silicon nitride layer, or a combination thereof.

7. The method for manufacturing an AMOLED backplane as claimed in claim 1, wherein the first gate terminal, the second gate terminal, and the electrode plate comprise a material of Mo.

8. The method for manufacturing an AMOLED backplane as claimed in claim 1, wherein the first and second source/drain terminals comprise a material of Ti/Al/Ti.

9. The method for manufacturing an AMOLED backplane as claimed in claim 1, wherein the anode comprises a material of ITO/Ag/ITO.

10. A method for manufacturing an active matrix organic light-emitting diode (AMOLED) backplane, which sequentially deposits a buffer layer and an amorphous silicon layer on a substrate, crystalizes and converts the amorphous silicon layer into a polysilicon layer and patternizes the polysilicon layer, and after depositing a gate insulation layer, first applies a photoresist pattern formed with a photolithographic process as a shielding layer to subject the patternized polysilicon layer to P-type heavy doping; and then deposits and patternizes a first metal layer on the gate insulation layer to form a gate terminal and applies the patternized first metal layer as a shielding layer to subject the patternized polysilicon layer to N-type light doping; and then deposits an insulation layer and subjects the insulation layer to non-isotropic etching to form spacers, and then applies the patternized first metal layer and the spacers as a shielding layer to subject the patternized polysilicon layer to N-type heavy doping to form symmetric light-doping drain areas;

comprising the following steps:

(1) providing a substrate and depositing a buffer layer on the substrate;

(2) depositing an amorphous silicon layer on the buffer layer and subjecting the amorphous silicon layer to excimer laser annealing treatment so as to crystalize and convert the amorphous silicon layer into a polysilicon layer; and then subjecting the polysilicon layer to patterning treatment so as to form a first polysilicon section, a second polysilicon section, and a third polysilicon section that are spaced from each other, where the third polysilicon section is located between the first polysilicon section and the second polysilicon section;

(3) depositing a gate insulation layer on the buffer layer and the first, second, and third polysilicon sections;

(4) applying a photolithographic process to form a photoresist pattern on the gate insulation layer, where the photoresist pattern completely shields the first polysilicon section, shields a middle portion of the second polysilicon section, and completely shields no third polysilicon section;

(5) with the photoresist pattern as a shielding layer, subjecting the patternized polysilicon layer to P-type heavy doping so as to form P-type heavy-doping areas respectively on opposite sides of the second polysilicon section and the third polysilicon section;

(6) removing the photoresist pattern and depositing and patterning a first metal layer on the gate insulation layer so as to form a first gate terminal, a second gate terminal, and an electrode plate, where the first gate terminal is located above a middle portion of the first polysilicon section;

(7) with the patternized first metal layer as a shielding layer, subjecting the patternized polysilicon layer to N-type light doping so as to form N-type light-doping areas respectively on opposite sides of the first polysilicon section that are not shielded by the first gate terminal;

(8) depositing an insulation layer on the gate insulation layer and the first gate terminal, the second gate terminal, and the electrode plate and then, subjecting the insulation layer to non-isotropic etching to form spacers, where the spacers that are located on the opposite sides of the first gate terminal are symmetric;

(9) with the patternized first metal layer and the spacers as a shielding layer, subjecting the patternized polysilicon layer to N-type heavy doping so as to form symmetric light-doping drain areas exactly below the spacers on the opposite sides of the first gate terminal; and

(10) applying deposition photolithographic, and etching processes to form, in sequence, an interlayer insulation layer, first and second source/drain terminals, a planarization layer, an anode, a pixel definition layer, and photo spacers on the gate insulation layer, wherein the first source/drain terminals are electrically connected to the N-type heavy-doping areas of the first polysilicon section and the second source/drain terminals are electrically connected to the P-type heavy-doping areas of the second polysilicon section and the anode is electrically connected to the second source/drain terminals; and the first polysilicon section, the first gate terminal, and the first source/drain terminals collectively form a switching thin-film transistor (TFT); the second polysilicon section, the second gate terminal, and the second source/drain terminals collectively form a driving TFT; and the third polysilicon section and the electrode plate collectively form a storage capacitor;

wherein the insulation layer comprises a silicon rich oxide layer or a silicon rich nitride layer;

wherein the P-type heavy doping applies a concentration that is higher than a concentration of the N-type heavy doping; and wherein the buffer layer comprises a silicon oxide layer, a silicon nitride layer, or a combination thereof.

* * * * *